United States Patent [19]

Kim et al.

[11] Patent Number: 5,270,968
[45] Date of Patent: Dec. 14, 1993

[54] THIN-FILM TRANSISTOR FOR SEMICONDUCTOR MEMORY DEVICE AND FABRICATING METHOD THEREOF

[75] Inventors: Jhang-rae Kim, Seoul; Han-soo Kim, Suwon, both of Rep. of Korea

[73] Assignee: Samsung Electronics Co., Ltd., Kyungo-do, Rep. of Korea

[21] Appl. No.: 906,369

[22] Filed: Jun. 30, 1992

[30] Foreign Application Priority Data

Dec. 27, 1991 [KR] Rep. of Korea .................. 91-24664
Apr. 21, 1992 [KR] Rep. of Korea .................. 92-6678

[51] Int. Cl.[5] .......................................... H01L 29/94
[52] U.S. Cl. ............................... 365/182; 437/41; 257/67; 257/369; 365/188; 365/163
[58] Field of Search .................. 365/182, 163, 188; 437/41; 257/67, 369

[56] References Cited

U.S. PATENT DOCUMENTS 4,820,652  4/1989  Hayashi ..................... 437/52
5,210,429  5/1993  Adan ........................ 257/67

Primary Examiner—Eugene R. LaRoche
Assistant Examiner—Viet Q. Nguyen
Attorney, Agent, or Firm—Cushman, Darby, Cushman

[57] ABSTRACT

Disclosed is a TFT for a semiconductor memory device and the fabricating method thereof, comprising a first conductive layer formed on a first insulating layer of a semiconductor substrate and doped with a first conductive type impurity, a second insulating layer formed on the first conductive layer, a contact hole formed in the second insulating layer above the first conductive layer, a semiconductor layer formed on a predetermined portion of the first conductive layer exposed in the contact hole, the inner walls of the contact hole and the second insulating layer, a thin-film gate insulating layer covering the semiconductor layer, a second conductive layer formed on a gate insulating layer to overlap the contact hole and its periphery, a first impurity region formed while upwardly dispersing the impurity of the first conductive layer into the semiconductor layer in contact with the first conductive layer of the contact hole, a second impurity region placed in the semiconductor layer of the second insulating layer, in which the first conductive impurity is doped, and a channel region limited between the first and second impurity regions and provided as a semiconductor layer of the inner side walls of the contact hole.

4 Claims, 2 Drawing Sheets

THIN-FILM TRANSISTOR FOR SEMICONDUCTOR MEMORY DEVICE AND FABRICATING METHOD THEREOF

BACKGROUND OF THE INVENTION

The present invention relates to a thin-film-transistor (TFT) for a semiconductor memory device and the fabricating method thereof, and more particularly to a PMOS TFT transistor of an SRAM with a 6-transistor memory cell configuration and the fabricating method thereof.

Recently, utilizing dynamic random access devices (DRAM) mass production lines, the makers of semiconductor memory devices have strived to increase the production of static random access memories (SRAMs) because of the increasing demand for SRAMs and the unstable price of DRAMs. The increase in the demand for SRAMs is because they have unique characteristics such as high speed, low power consumption, no refresh requirements and a simplified system design, and due to the trend toward multifunctional, high-quality, miniaturized and lightweight systems. However, since SRAMs have a more complicated cell structure than DRAMs, the density of the SRAMs is behind by one generation.

Current SRAMs are divided into 4-transistor and 6-transistor cell configurations. The 4-transistor type leads with respect to capacity, employing a memory cell of NMOS form having a polysilicon as a high resistance load and periphery circuits of CMOS form. Due to chip size, 256 Kb SRAMs are produced primarily, disregarding low power consumption SRAMs having full CMOS configuration. Therefore, recently, a stack-type TFT changing the high resistance polysilicon load into one for PMOS, is adopted to reduce the power consumption and maintain a chip size similar to that of the conventional 4-transistor type ("Symposium on VLSI Technology," 1990, pp. 19-24).

However, source, drain and channel regions of a conventional TFT are arranged in a two-dimensional plane structure to occupy large areas. Accordingly, the TFT in a two-dimensional structure impedes the high density and large capacity of an SRAM.

SUMMARY OF THE INVENTION

The object of the present invention is to provide a three-dimensional TFT for a semiconductor memory device.

Another object of the present invention is to provide the most suitable method for fabricating the aforementioned TFT.

In order to achieve one object of the present invention, there is provided a TFT comprising:

a first conductive layer formed on a first insulating layer and doped with first conductive type impurities;

a second insulating layer covering the first conductive layer;

an opening formed in the second insulating layer on the first conductive layer;

a semiconductor layer formed on the surface of the first conductive layer exposed in the opening and on the surface of the predetermined portion of the second insulating layer;

a thin gate insulating layer covering the semiconductor layer;

a second conductive layer formed on the thin gate insulating layer in and around the opening;

a first impurity region formed in the first portion of the semiconductor layer in contact with the first conductive layer in the bottom of the opening and doped with the first conductive type impurities;

a second impurity region formed in the second portion of the semiconductor layer on the second insulating layer, and doped with the first conductive type impurities; and a channel region defined between the first and second impurity regions in the semiconductor layer.

To achieve the other object, the TFT according to the present invention is manufactured by the steps of:

forming a first conductive layer doped with a first conductive type impurities on a first insulating layer;

covering the first conductive layer with a second insulating layer;

forming an opening in the second insulating layer of on the first conductive layer;

forming a semiconductor layer on the surface of the first conductive layer exposed in the opening and on the surface of the predetermined portion of the second insulating layer;

covering the semiconductor layer with a thin gate insulating layer and simultaneously forming a first impurity region in a first portion of the semiconductor layer in contact with the exposed first conductive layer by means of the upward diffusion of the impurities in the first conductive layer;

forming a second conductive layer on the thin gate insulating layer in and around the opening; and forming a second impurity region in a second portion of the semiconductor layer which does not cover the second conductive layer on the second insulating layer by means of an impurity doping process.

BRIEF DESCRIPTION OF THE DRAWINGS

The above object and other advantages of the present invention will become more apparent by describing in detail a preferred embodiment of the present invention with reference to the attached drawings in which.

DETAILED DESCRIPTION OF THE INVENTION

A TFT for a conventional semiconductor memory device will be explained prior to the embodiment of the present invention.

Figure 1A:
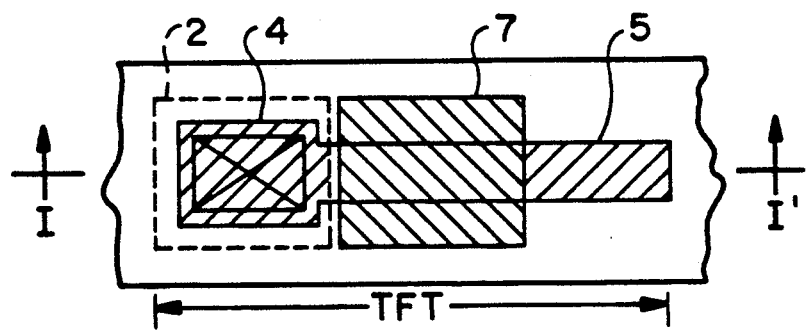
FIG. 1A is a plane layout of a conventional TFT for a semiconductor memory device.
Figure 1B:
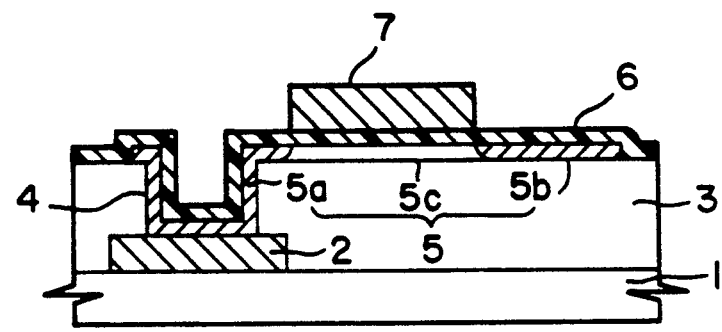
FIG. 1B is a cross-sectional view of a TFT taken along line I—I shown in FIG. 1A.

Conventionally, referring to FIGS. 1A and 1B, a pattern of a first conductive layer 2 of a polysilicon provided as a drain contact pad of a PMOS TFT is formed on first insulating layer 1, and then a second insulating layer 3 is formed. After an opening, e.g., a via hole or a contact hole 4 is formed on second insulating layer 3, an amorphous silicon semiconductor layer 5 is deposited and then patterned. After a TFT gate insulating layer 6 is formed on semiconductor layer 5, a second conductive layer 7 of polysilicon is deposited on gate insulating layer 6 and then patterned. Thus, a gate electrode of a TFT is formed to overlap semiconductor layer 5 in a predetermined region on second insulating layer 3. Successively, p-type impurities are ion-implanted or ion-injected into that portion of semiconductor layer 5 not overlapped by second conductive layer 7, to be self-aligned, thereby forming source and drain regions 5a and 5b of the PMOS TFT. The semiconductor layer between source and drain regions 5a and 5b is provided as a channel region 5c of the PMOS TFT. That is, since the PMOS TFT provided as a load of a conventional SRAM is formed on a two-dimensional plane, a predetermined region should be allocated, which impedes the high density and large capacity of SRAM.

Figure 2A:
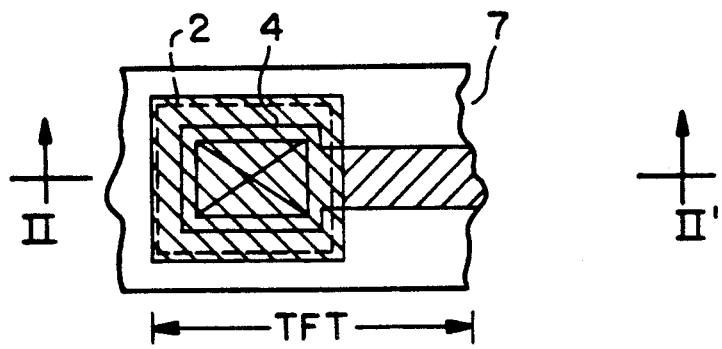
FIG. 2A is a plane layout of a TFT for a semiconductor memory device according to the present invention.
Figure 2B:
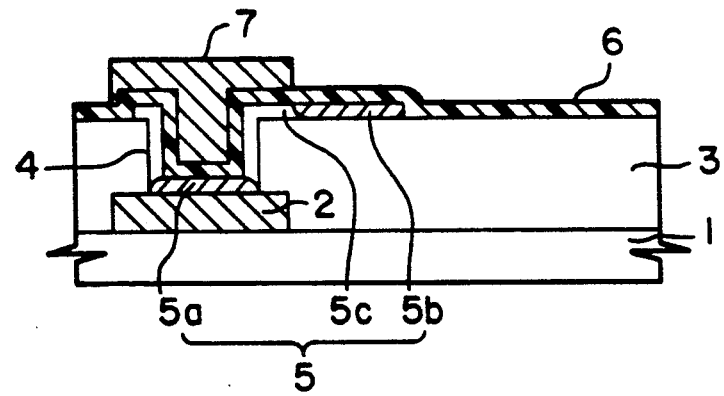
FIG. 2B is a cross-sectional view of a TFT taken along line II—II shown in FIG. 2A.

Therefore, in the present invention, there is provided a three-dimensional structure in order to reduce the area occupied by a PMOS TFT of a SRAM. FIG. 2A is a plane layout of a three-dimensional TFT according to the present invention, and FIG. 2B is a cross-sectional view taken along line II—II of FIG. 2A. The difference between the present invention and the prior art is that a semiconductor layer formed on the inner wall of a drain contact hole of the PMOS TFT is employed as channel region 5c, and a semiconductor layer formed on the bottom of contact hole 4 is employed as source region 5a. The pattern of second conductive layer 7 provided as a gate electrode is formed to cover the contact hole. Also, source region 5a is formed by the upward diffusion of p-type impurities, namely a first conductive impurity placed in first conductive layer 2 provided as a source contact pad. According to the above structure, the channel size of the PMOS TFT can be adjusted to the diameter or depth of the contact hole. Therefore, the area is reduced by about 40% as compared with the area occupied by the conventional PMOS TFT. Also, the degree of freedom in wiring is greatly improved.

The fabricating method of a preferred embodiment of the TFT according to the present invention comprises the steps shown in FIGS. 3A to 3E.

Figure 3A:
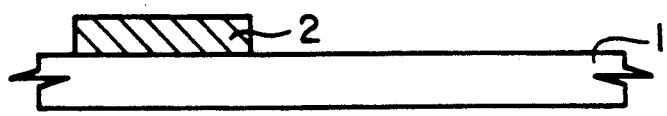
FIGS. 3A-3E show the fabricating process of a TFT for a semiconductor memory device according to the present invention.

Referring to FIG. 3A, a 500–2,000 Å thick, first conductive layer 2 (for example, polysilicon or noncrystal silicon) is deposited on planarized first insulating layer 1 on a semiconductor substrate (not shown). Then, p-type impurities are ion-implanted or injected to the concentration of $1\times10^{13}$–$5\times10^{15}$/cm$^2$, followed by forming the pattern of first conductive layer 2 by means of an ordinary photo-etching method.

Figure 3B:
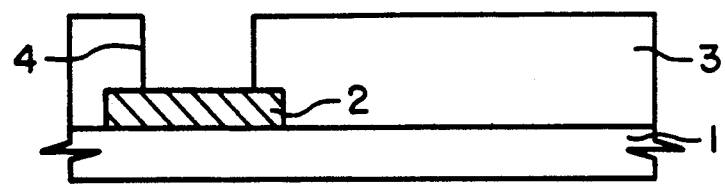

Referring to FIG. 3B, a 2,000–10,000 Å thick, second insulating layer 3 is formed on the pattern of first conductive layer 2. Successively, a contact hole 0.2–0.8 μm in diameter is formed in second insulating layer 3 above first conductive layer 2 by means of an ordinary photo-etching method, to expose first conductive layer 2.

Figure 3C:
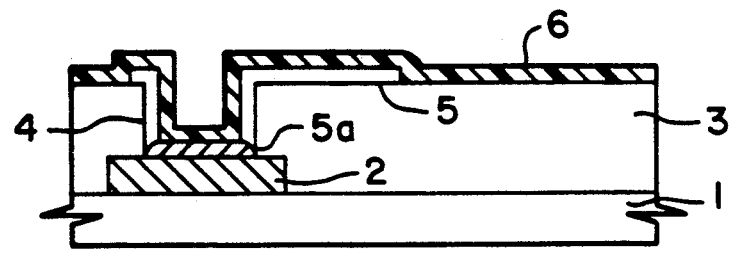

Referring to FIG. 3C, a 100–1,000 Å thick, semiconductor layer 5 made of an amorphous silicon is deposited on second insulating layer 3 wherein contact hole 4 is formed, and then the pattern of semiconductor layer 5 is formed by means of an ordinary photo-etching method. Successively, a gate insulating layer 6 of the same thickness (100–1000 Å) serving as an oxide layer is coated on semiconductor layer 5, by chemical vapor method. At this time, the p-type impurities are diffused upwardly from first conductive layer 2 into semiconductor layer 5, so that a p-type impurity region, namely, source region 5a, is formed in semiconductor layer 5 and in contact with first conductive layer 2.

Figure 3D:
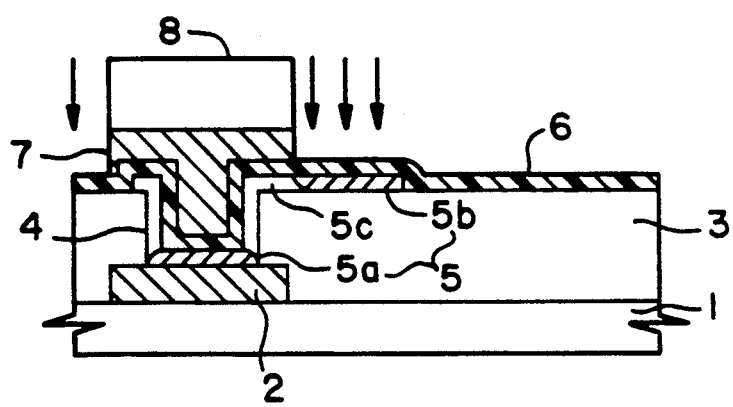
Figures 1, 3D:
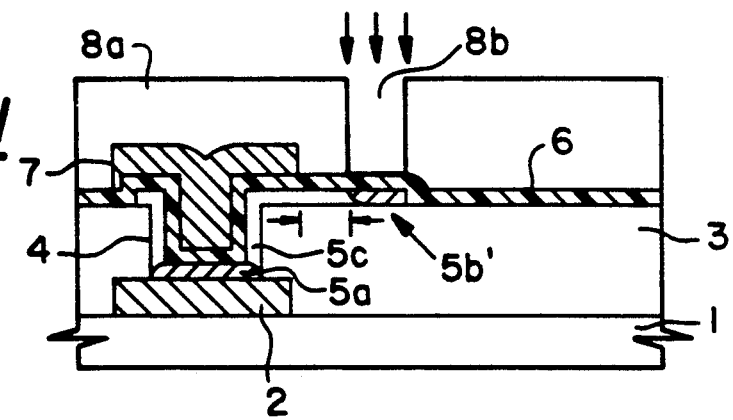

Referring to FIG. 3D, a 500–2,000 Å thick, second conductive layer 7 (for example, polysilicon or amorphous silicon) is deposited on gate insulating layer 6, and then n-type or p-type impurities are doped into second conductive layer 7 to the concentration of $1\times10^{14}$–$1\times10^{16}$/cm$^2$. The pattern of second conductive layer 7 is formed by an ordinary photo-etching method, and is provided as a gate electrode. Successively, prior to removing a photoresist 8 for forming the pattern of second conductive layer 7, p-type impurities are ion-implanted or injected to the concentration of $1\times10^{13}$–$5\times10^{15}$/cm$^2$ in that portion of semiconductor layer 5 not overlapped by second conductive layer 7, thus forming a p-type impurity region, namely, drain region 5b. Otherwise, as illustrated in FIG. 3D-1, after photoresist 8 is removed, a photoresist 8a is formed and then an opening 8b is formed therein. Then, via opening 8b, a p-type impurity region 5b' is formed in a predetermined region of semiconductor layer 5.

Figure 3E:
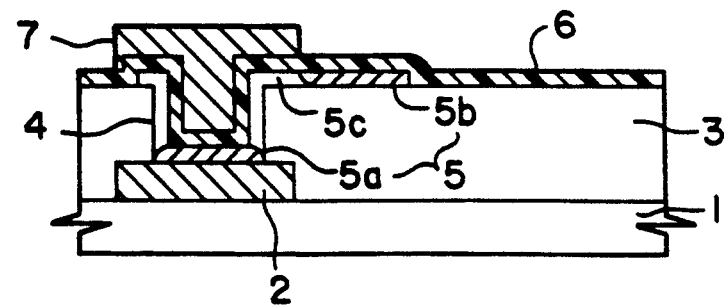

Referring to FIG. 3E, the PMOS TFT is completed by removing the photoresist (8 or 8a). A channel region 5c of such a PMOS TFT is provided as a semiconductor layer formed on the inner walls of contact hole 4, and as a semiconductor layer where the p-type impurities are not implanted by the pattern of second conductive layer 7.

As above, in the SRAM of the present invention having an amorphous silicon PMOS TFT load, by overlapping the source contact region of the PMOS TFT and the second conductive layer provided as a gate electrode, the semiconductor layer on the side walls of the contact hole is provided as a channel region to form a three-dimensional TFT, so that the area occupied by the TFT is reduced, to thereby enhance the density and capacity of a SRAM as well as the degree of freedom in wiring.

While the invention has been particularly shown and described with reference to preferred embodiments thereof, it will be understood by those skilled in the art that various changes in form and details may be made therein without departing from the spirit and scope of the invention as defined by the appended claims.

What is claimed is:

1. A TFT for a semiconductor memory device comprising:
   a first conductive layer formed on a first insulating layer and doped with first conductive type impurities;
   a second insulating layer covering said first conductive layer;
   an opening formed in said second insulating layer on said first conductive layer;
   a semiconductor layer formed on the surface of said first conductive layer exposed in said opening and on the surface of the predetermined portion of said second insulating layer;
   a thin gate insulating layer covering said semiconductor layer;
   a second conductive layer formed on said thin gate insulating layer in and around said opening;
   a first impurity region formed in the first portion of said semiconductor layer in contact with said first conductive layer in the bottom of said opening and doped with the first conductive type impurities;
   a second impurity region formed in the second portion of said semiconductor layer on said second insulating layer, and doped with the first conductive type impurities; and a channel region defined between said first and second impurity regions in said semiconductor layer.

2. A TFT for a semiconductor memory device as claimed in claim 1, wherein the size of said channel region is determined by the diameter or depth of said opening.

3. A TFT for a semiconductor memory device as claimed in claim 1, wherein said first conductive type impurities are p-type.

4. A TFT for a semiconductor memory device as claimed in claim 1, wherein the impurities of said first impurity region diffuse upwardly from said first conductive layer.

* * * * *